United States Patent
Levine et al.

(10) Patent No.: US 10,101,424 B2
(45) Date of Patent: Oct. 16, 2018

(54) ROBUST PRINCIPAL COMPONENT ANALYSIS FOR SEPARATION OF ON AND OFF-RESONANCE IN 3D MULTISPECTRAL MRI

(71) Applicant: The Board of Trustees of the Leland Stanford Junior University, Palo Alto, CA (US)

(72) Inventors: Evan G. Levine, Redwood City, CA (US); Brian A. Hargreaves, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 197 days.

(21) Appl. No.: 15/387,616

(22) Filed: Dec. 21, 2016

(65) Prior Publication Data

US 2018/0172788 A1  Jun. 21, 2018

(51) Int. Cl.
| | |
|---|---|
| *G01R 33/483* | (2006.01) |
| *G01R 33/561* | (2006.01) |
| *G01R 33/48* | (2006.01) |
| *G01R 33/565* | (2006.01) |

(52) U.S. Cl.
CPC ..... *G01R 33/4835* (2013.01); *G01R 33/4818* (2013.01); *G01R 33/5611* (2013.01); *G01R 33/56536* (2013.01)

(58) Field of Classification Search
CPC ............ G01R 33/4818; G01R 33/4835; G01R 33/5611; G01R 33/56536
See application file for complete search history.

(56) References Cited

U.S. PATENT DOCUMENTS

| | | | |
|---|---|---|---|
| 9,316,707 B2* | 4/2016 | Khalighi | G01R 33/246 |
| 2014/0117987 A1* | 5/2014 | Yui | G01R 33/28 |
| | | | 324/309 |
| 2016/0154080 A1 | 6/2016 | Wiens | |

OTHER PUBLICATIONS

Koch, et al., "A multi-spectral three-dimensional acquisition technique for imaging near metal implants," Magnetic Resonance in Medicine, 2009, vol. 61, No. 2, pp. 381-390.

(Continued)

*Primary Examiner* — Gregory H Curran
(74) *Attorney, Agent, or Firm* — Lumen Patent Firm

(57) ABSTRACT

Accelerated 3D multispectral imaging (MSI) on a magnetic resonance imaging (MRI) system uses phase-encoding in two dimensions and frequency-encoding in the third. The method generates randomized k-space undersampling patterns that vary between different spectral bins to determine k-space samples to be acquired in each spectral bin; orders k-space samples into echo trains that determine gradient waveforms; initializes the gradient waveforms, RF waveforms, and timing information; plays the gradient and RF waveforms using the timing information to excite and refocus different spatial and spectral bin regions; acquires undersampled MRI signal data on the MRI system from the spatial and spectral bin regions; uses robust principal component analysis to reconstruct on-resonance images and off-resonance images represented as sets of low rank and sparse matrices from the undersampled MRI signal data; combines the on-resonance images and off-resonance images to yield a final image; and presents the final image on a display.

17 Claims, 7 Drawing Sheets

(56) References Cited

OTHER PUBLICATIONS

Nittka et al., "Highly accelerated semac metal implant imaging using joint compressed sensing and parallel imaging," in Proceedings of the 21st Annual Meeting of ISMRM, Salt Lake City, Utah, 2013, vol. 2558.
Koch et al., "Combined parallel imaging and compressed sens-ing on 3d multi-spectral imaging near metal implants," in Proceedings of the 21st Annual Meeting of ISMRM, Montreal, Canada, 2011, p. 3172.
Wright et al., "Robust princi-pal component analysis: Exact recovery of corrupted low-rank matrices via convex optimization," in Advances in neural information processing systems, 2009, pp. 2080-2088.
Candes et al., "Robust principal component analysis?" Journal of the ACM (JACM), 2011, vol. 58, No. 3, p. 11.
Boyd et al., "Distributed op- timization and statistical learning via the alternating direction method of multipliers," Foundations and Trends in Machine Learning, 2011, vol. 3, No. 1, pp. 1-122.
Chen et al., "Parallel mri near metallic implants," in Proc Int Soc Magn Reson Med, 2009, vol. 2783.
Lustig et al., "SPIRiT: Iterative self-consistent parallel imaging reconstruction from arbitrary k-space," Magnetic Resonance in Medicine, Aug. 2010, vol. 64, No. 2, pp. 457-471.
Achlioptas et al., "Fast computation of low-rank matrix approximations," Journal of the ACM (JACM), 2007, vol. 54, No. 2, p. 9.
Halko et al., "Finding structure with randomness: Probabilistic algorithms for constructing approximate matrix decompositions," SIAM review, 2011, vol. 53, No. 2, pp. 217-288.
Liberty et al., "Randomized algorithms for the low-rank approximation of matrices," Proceedings of the National Acdemy of Sciences, 2007, vol. 104, No. 51, pp. 20 167-20 172.
Koch et al., "Imaging near metal with a mavric-semac hybrid," Magnetic resonance in medicine, 2011, vol. 65, No. 1, pp. 71-82.
Worters et al., "Compressed-sensing multispectral imaging of the postoperative spine," Journal of Magnetic Resonance Imaging, 2013, vol. 37, No. 1, pp. 243-248.
Sveinsson et al., "Hexagonal undersampling for faster MRI near metal-lic implants," Magnetic Resonance in Medicine, 2014.
Shi et al., "Accelerated imaging of metallic implants using model-based nonlinear reconstruction," in Proceedings of the 24th Annual Meeting of ISMRM, Singapore, 2016.
Nencka et al., "Reduced field of view multi-spectral imaging through coupled coil and frequency bin encoding," in Proceedings of the 24th Annual Meeting of ISMRM, Singapore, 2016, p. 2257.
Smith et al., "Accelerating sequences in the presence of metal by exploiting the spatial distribution of off-resonance," Magnetic resonance in medicine, vol. 72, No. 6, pp. 1658-1667, 2014.
Yoon et al., "Fast semac by separation of on-resonance and off-resonance signals," in Proc Int Soc Magn Reson Med, vol. 91, 2014.
Levine et al., "3d cartesian mri with compressed sensing and variable view sharing using complementary poisson-disc sampling," Magnetic Resonance in Medicine, 2016.
Trzasko et al., "Calibrationless parallel mri using clear," in Signals, Systems and Computers (ASILOMAR), 2011 Conference Record of the Forty Fifth Asilomar Conference on. IEEE, 2011, pp. 75-79.
Levine et al., "An image domain low rank model for calibrationless reconstruction of images with slowly varying phase," in Proceedings of the 23rd Annual Meeting of ISMRM, Toronto, Canada, 2015, p. 3624.

\* cited by examiner

ROBUST PRINCIPAL COMPONENT ANALYSIS FOR SEPARATION OF ON AND OFF-RESONANCE IN 3D MULTISPECTRAL MRI

STATEMENT OF GOVERNMENT SPONSORED SUPPORT

This invention was made with Government support under contracts EB015891 and EB017739 awarded by the National Institutes of Health. The Government has certain rights in the invention.

FIELD OF THE INVENTION

This invention relates generally to systems and methods for magnetic resonance imaging (MRI). More specifically, it relates to techniques for multispectral imaging (MSI) in MRI.

BACKGROUND

Magnetic resonance imaging (MRI) is widely used in clinical imaging. However, the presence of metallic implants can either preclude the use of MRI due to safety or limit the diagnostic quality of MRI due to induced variation in the static magnetic field. Distortion-free imaging near MRI-safe devices has been enabled by 3D multispectral imaging (MSI) techniques, including slice encoding for metal artifact correction (SEMAC), multi-acquisition variable-resonance image combination (MAVRIC) [1], and the MAVRIC-SEMAC hybrid, MAVRIC-SL [2].

However, the additional dimensions required to resolve slice distortion induced by off-resonance resulting from metal lead to long scan times and reduced signal-to-noise ratio (SNR), even when distortions only comprise a small fraction of the image. For an image consisting only of on-resonance, slice phase encoding is redundant, motivating the need for a method that exploits this redundancy to reduce acquisition requirements.

Constrained image models have enabled accelerated imaging with improved SNR, coverage, and resolution by exploiting a priori information about images and image formation. Parallel imaging, partial Fourier imaging, and compressed sensing are widely used examples that have been applied to 3D MSI. Some work using compressed sensing to exploit the sparse support of slice profiles has shown potential (approximately twofold acceleration) [3, 4, 5]. The spatial support structure of excited slices can also be used as a constraint, and this approach offers up to twofold acceleration [6]. However, these methods do not exploit dependencies between bins. One approach is to explicitly represent the relationship between the image (magnetization) and signal parameters (magnetic field) in image reconstruction [7], but accurate modeling of image formation and the required nonlinear optimization are both challenging. Another approach is to use a generalized sensivity encoding framework, which also requires a calibration [8].

To our knowledge, little work has been done to exploit the redundancy of slice phase encoding for the on-resonance signal and spatial distribution of off-resonance. The spatial distribution of off-resonance bins in MAVRIC using a novel calibration procedure across bins was previously introduced, but its efficacy in combination with parallel imaging was not demonstrated and its physical basis and potential beyond MAVRIC was not demonstrated [9]. In SEMAC and the hybrid method, the spatial extent of off-resonance has been constrained on a bin-by-bin basis [10], but the model is limited by the spatial support of the excited slice.

SUMMARY OF THE INVENTION

Techniques are disclosed which are based on separation of on-resonance and metal-induced off-resonance signals in 3D MSI scans. Using a constrained reconstruction based on separation of on and off-resonance signals, it can push scan time limitations of accelerated 3D multispectral MRI near metallic implants by three to four times that of current methods. The techniques of the present invention provide improved efficiency for MRI near metal, enabling combinations of 1) shorter scan time for faster clinical workflow 2) higher resolution and coverage, 3) use of shorter echo train lengths, or 4) reduced slice thickness. The optimization framework provides ease of integration with other reconstruction techniques and acceleration methods, including conventional partial Fourier and parallel MRI acceleration. In addition, because minimal assumptions are made about the underlying signal, the techniques of the present invention provide flexibility to vary slice profiles without modifications to the reconstruction. Embodiments of the invention are applicable to systems for MRI near metallic implants using 3D multispectral MRI based on slice phase encoding.

Innovative features of embodiments of the invention include: Separation of on- and off-resonance signals from multispectral images based on slice phase encoding using the aforementioned low rank and sparsity constraints; Use of the aforementioned signal separation for image reconstruction from undersampled k-space data; Use of a complementary sampling pattern to vary the aliasing patterns in subsequent spectral bins allowing joint reconstruction of bins; Addition of a calibration-free reconstruction model for multi-channel images with slowly varying phase, eliminating the need for a calibration region and allowing additional flexibility to achieve the aforementioned sampling properties.

In one aspect, the invention provides a method of accelerated 3D multispectral imaging (MSI) based on phase-encoding in two dimensions and frequency-encoding in the third, implemented on a magnetic resonance imaging (MRI) system. The method includes generating randomized variable-density k-space undersampling patterns that vary between different spectral bins to determine k-space samples to be acquired in each spectral bin; ordering k-space samples into echo trains that determine gradient waveforms; initializing the gradient waveforms, RF waveforms, and timing information; playing the gradient and RF waveforms using the timing information to excite and refocus different spatial and spectral bin regions; acquiring undersampled MRI signal data on the MRI system from the spatial and spectral bin regions; reconstructing on-resonance images and off-resonance images represented as sets of low rank and sparse matrices from the undersampled MRI signal data, where the reconstructing uses a robust-principal-component-analysis-based algorithm implemented on a CPU or GPU; combining the images on the CPU or GPU to yield a final image; and presenting the final image on a display.

The robust-principal-component-analysis-based algorithm that is used in reconstructing on-resonance images and off-resonance images may be implemented in various ways. For example, the implementation may include constraining a low rank matrix used in the robust-principal-component-analysis-based algorithm to have rank one. It may include representing the off-resonance images in a transform domain using a fixed, non-adaptive transform. It may include using CLEAR to impose an additional penalty to enable a combination with parallel imaging, or using a modified CLEAR penalty to impose an additional penalty to enable a combination with parallel imaging when partial k-space sampling is used. It may include incorporating a constraint for autocalibrating parallel imaging, either using an explicit model of coil sensitivities or kernel encoding local correlations in k-space.

The implementation may include performing all matrix constructions on a coil-by-coil basis, yielding unique rank one and sparse matrices for each coil. The implementation may include performing all matrix constructions at each readout location, yielding unique rank one and sparse matrices for each readout location and enabling reconstructions of each readout location to be carried out in parallel. The implementation may include performing all matrix constructions within contiguous segments along the y dimension, yielding unique rank one and sparse matrices for each coil. The implementation may include incorporating a pre-computed on-resonance bin profile with a spatially-varying scaling to model on-resonance signals, while the sparsity of off-resonance signals is maintained.

The generation of the randomized k-space undersampling patterns may include using variable-density sampling patterns to decrease sampling density towards outer regions of k-space. The generation of the randomized k-space undersampling patterns may include varying the undersampling patterns in different bins, e.g., such that the variations in undersampling patterns in different bins are chosen to impose a separation between samples that is determined by the slice profiles and overlap. The generation of the randomized k-space undersampling patterns may include using complementary Poisson-disc sampling patterns to generate the randomized k-space undersampling patterns and achieve a variation between sampling in different bins. The generation of the randomized k-space undersampling patterns may include performing partial k-space sampling, where one side of k-space is not acquired and reconstructing images comprises an assumption of slow phase variation in the images.

These and other variations will become more apparent from the following description and referenced figures.

DETAILED DESCRIPTION

Figure 1:
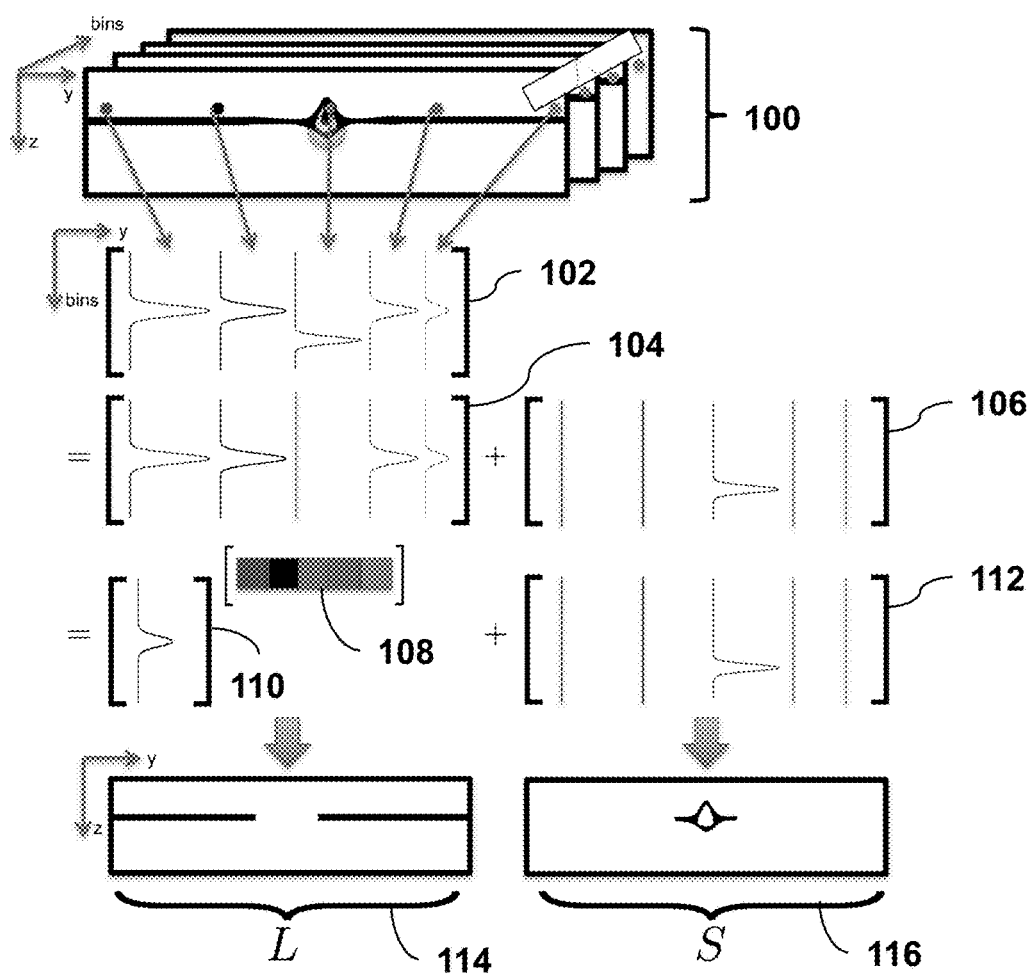
FIG. 1 is a schematic illustration of the processing of 3D MSI bin images into on-resonance and off-resonance components, according to an embodiment of the invention.

Embodiments of the invention use a highly constrained reconstruction based on separation of on- and off-resonance signal components of 3D MSI images. Embodiments preferably include complementary sampling, calibration-free reconstruction, and low-rank-plus-sparse decomposition.

A complementary, randomized sampling strategy that varies the aliasing pattern along bins with noise-like properties is described. Due to overlap in the RF profiles, acquiring the same phase encode location in subsequent bins is redundant, and to avoid this, we use a complementary sampling pattern previously proposed for dynamic contrast-enhanced MRI [11].

Calibration-free reconstruction allows flexibility in undersampling, robust parallel imaging, and partial k-space acceleration. This novel calibration-free reconstruction extends CLEAR [12] for images with slowly varying phase.

In low-rank-plus-sparse decomposition, multi-bin images are decomposed into a sum of two images, the first associated with on-resonance (L) and the second with off-resonance (S). The "L"-image is constrained to satisfy a separability constraint that arises from the fact that voxels that are on-resonance have identical bin profiles up to scaling. The signals not satisfying this constraint are modeled by a sparse "S" image. The separation is achieved with minimal assumptions about the underlying physical mechanisms beyond these constraints, including the specific RF profiles used.

Experiments with retrospective undersampling have demonstrated that these techniques enable higher acceleration factors due to the compactness of the L+S representation. A complementary, randomized k-space segmentation scheme is used to vary the aliasing artifacts between bins. To overcome sampling limitations imposed by the relatively large calibration region, a novel computationally efficient calibration-free parallel imaging reconstruction method is used.

We first describe the MRI signal derived from 3D MSI sequences that use slice phase encoding. We refer to excited slices as "bins." The signal in a voxel x, y, z in bin b of $N_b$ bins and coil c of $N_c$ coils can be written $$s(x,y,z,c,b) = RF(\Delta f(x,y,z) + \gamma G_z z - f_b) m(x,y,z,c) \qquad (1)$$

where m(x, y, z, c) is the signal in channel c at voxel (x, y, z), and $RF(\gamma G_z z - f_b)$ is the RF profile weighting for bin b (bin profile) with frequency offset $f_b$, and $G_z$ is the slice select gradient strength, and $\gamma$ is the Larmor frequency. For voxels that are on-resonance ($\Delta f=0$), (1) can be written $$s(x, y, z, c, b) = \underbrace{RF(\gamma G_z z - f_b)}_{\text{function of } z, b} \underbrace{m(x, y, z, c)}_{\text{function of } x, y, z, c} \qquad (2)$$

At a fixed z, (2) can be expressed as the product of a function of b and a function of x, y, c. For a slice z ∈ {1, 2, . . . , $N_z$}, define the Casorati matrix $$C_z=[vec(s(:,:,z,:,1))vec(s(:,:,z,:,2))\ldots vec(s(:,:,z,:,N_b))] \quad (3)$$

where s(:, :, z, :, b) denotes an array consisting of all elements of the array s extracted at slice z and bin b, and where the operator vec(•) vectorizes its argument. Due to the separable form of (2), $C_z$ is a rank 1 matrix. The total signal in the image is the superpositions of spins, and voxels near metallic implants have different bin profiles that do not satisfy this property and can be viewed as a sparse additive component.

FIG. 1 is an illustration of this proposed robust principal component analysis framework. From 3D MSI bin images 100, elements of each image at a fixed z location are arranged to form a matrix of bin profiles 102 at different y locations. Each bin profile is a waveform with a Gaussian shape at a specified y location. The matrix of profiles 102 can be decomposed into on-resonance (z-dependent rank 1 matrix L) 114 and off-resonance (sparse component S) 116. These bin profiles can be written as a sum of on-resonance 104 and off-resonance 106 bin profiles. As all on-resonance bin profiles are identical up to scaling, the matrix 104 can can be rewritten as a rank one matrix represented by the on-resonance bin profile 110 and y-dependent scaling 108, while the off-resonance bin profiles are sparse 112. These matrices from all z locations make up the components L 114 and S 116. One may view L 114 as having a number of degrees of freedom independent of the number of bins, which is what one has to resolve in the absence of metal, while S 116 has just enough signal to "fill in" the differences resulting from the presence of metal.

Figure 2:
FIG. 2 shows an image of a hip together with corresponding component images illustrating separation of energy near a metal implant, according to an embodiment of the invention.

A simple way to see these properties is to construct $C_z$ matrices from fully-sampled images, use an singular value decomposition (SVD) to separate the first component from the image, and reformat these matrices into images. Even before invoking principles of sparsity, described later, this shows that the first singular value associated with on-resonance is dominant and contains 93% of the energy in an image of a hip with a metal implant. FIG. 2, for example, shows an original image 200 of a hip with a metal implant together with an on-resonance image 202 containing dominant singular value in the extracted $C_z$ matrices comprising 93% of the energy, and an off-resonant image 204 showing the residual energy near the metal.

The a priori assumption that the image consists of an outlier-corrupted rank 1 matrix is the basis for the method, which is inspired by robust principal component analysis (RPCA) [13, 14]. The rank one matrix and outliers can be separated directly from undersampled data by solving

P1:  (4)

$$\underset{L,S}{\text{minimize}} \|Y - \mathcal{F}_u\{L+S\}\|_2^2 + \lambda_S \|TS\|_{2,1} + J_{CLEAR}(L+S) + \sum_{z=1}^{N_z} J_C(C_z)$$

$$\text{subject to } L = [vec(C_1)^T, \ldots, vec(C_{N_z})^T]^T$$

where $\mathcal{F}_u$ is a forward model consisting of a Fourier transform and sampling, L is a $\mathcal{F}$ concatenation of $C_z$, T is a transform (e.g. wavelet) applied coil-by-coil in y-z-bins space $C$ used to induce sparsity in the off-resonance, and the third term is a penalty term for CLEAR parallel imaging [12], described in detail in the following section, and $J_C$ is a low-rank inducing penalty, and the $l_{2,1}$ norm used in the second term is defined for x with element $x_{i,c}$ corresponding to coil c and transform-domain coefficient i as $$\|x\|_{2,1} = \sum_i \sqrt{\sum_{c=1}^{N_c} |x_{i,c}|^2} \quad (5)$$

The optimization problem P1 can be solved using an augmented lagrangian method [15], which can be readily integrated with other constraints. The resulting "L image" and "S image" comprised of on and off-resonance can then be combined by complex summation to yield a single image.

Many commercial MRI scanners provide 3D MSI sequences that are used for muscu-loskeletal imaging near metallic implants. Overlapping Gaussian-shaped slice profiles are commonly used, which result in Gaussian bin profiles. To accelerate scanning and ensure accurate reconstruction with robust PCA, the system must provide both randomization and variation in the sampling of different spectral bins that depends on bin overlap. A carefully-designed sampling scheme is required in combination with the reconstruction. Complementary Poisson-disc sampling, previously used for dynamic MRI [11], is randomized and can be used to fine-tune the separation between samples in $k_y$-$k_z$-bins space to minimize redundant sampling.

Figure 3:
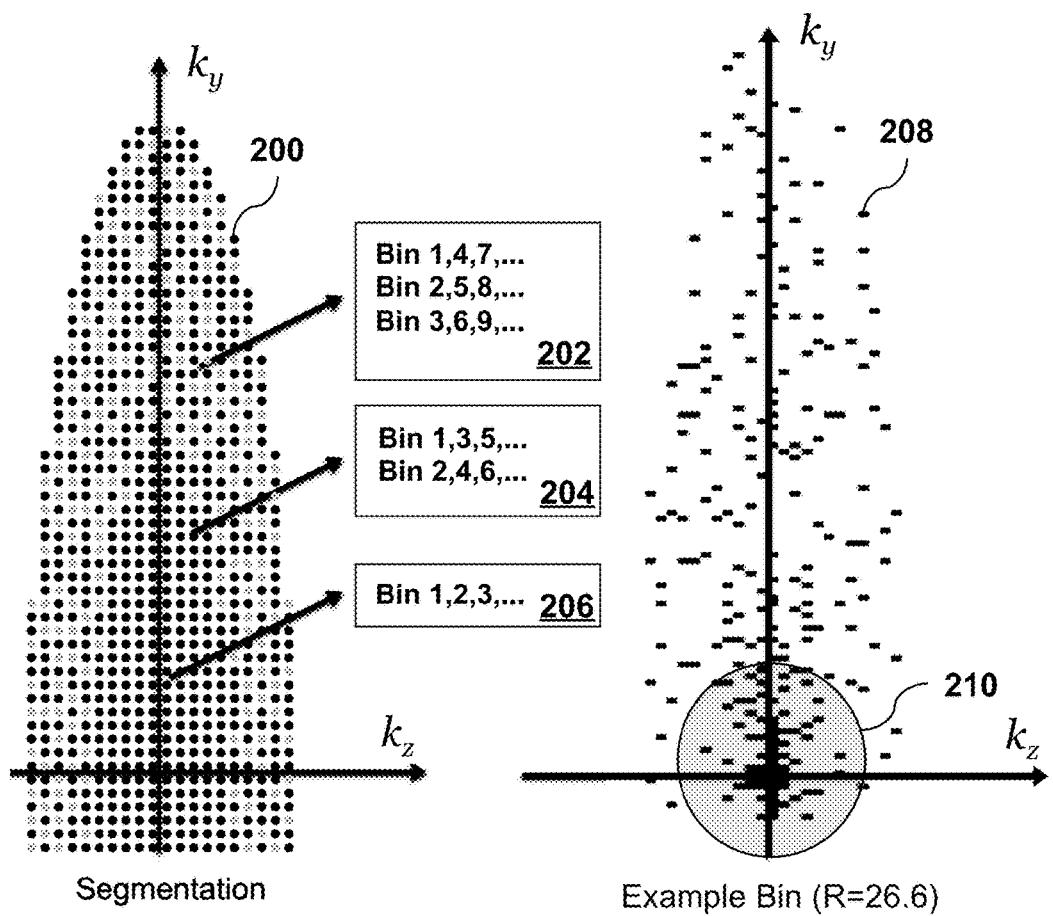
FIG. 3 shows k-space graphs illustrating the use of complementary Poisson-disc sampling to segment annular regions of the phase encode plane into sample distributions with minimum spacing in $k_y$-$k_z$-bins space, according to an embodiment of the invention.

FIG. 3 illustrates a variable-density complementary Poisson-disc k-space sampling scheme that is used to segment annular regions of the phase encode plane into sample distributions with minimum spacing in $k_y$-$k_z$-bins space. On the left, dots 200 show sample locations acquired within an elliptical region, where differently shaded dots correspond to different subsets of bins in which the sample is acquired. Toward the outer annular regions of k-space, higher undersampling may be used by acquiring each sample in a smaller subset of the bins. In the inner-most region, the samples are acquired in all bins 206. In the second region, the samples are acquired in every other bin 204, and in the third region, the samples are acquired in every third bin 202.

An example is shown in FIG. 3 on the right, where small blocks 208 indicate acquired samples and the sizes of regions that were chosen to achieve an overall reduction factor of R=26.6 (a fraction 1/26.6 of k-space data is acquired). The disk 210 represents the region of k-space that would be required for calibration for parallel imaging and partial Fourier.

Figure 4:
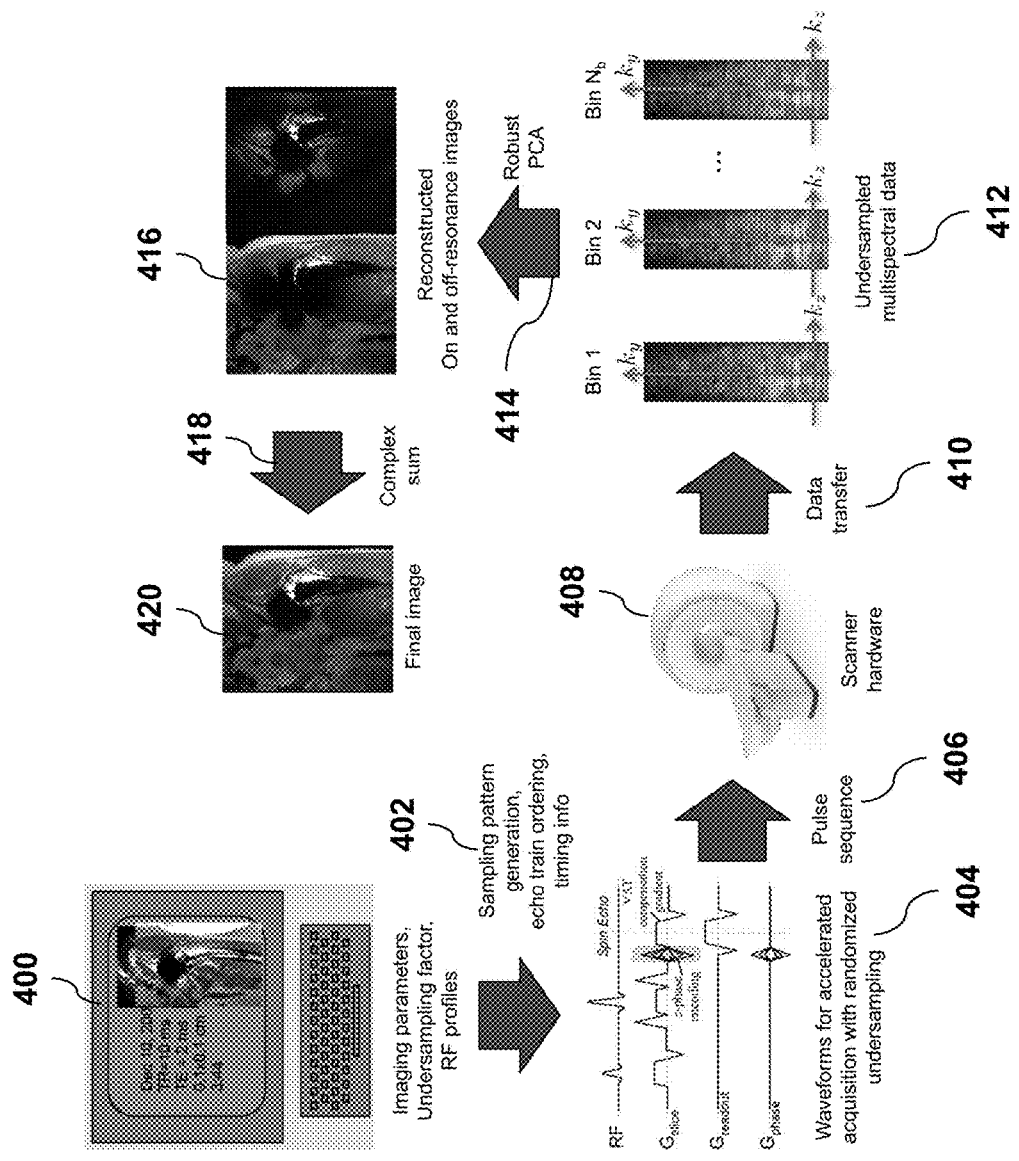
FIG. 4 is a flow diagram illustrating a method for accelerated acquisition, according to an embodiment of the invention.

An overview of a method of accelerated acquisition according to one embodiment of the invention is shown in FIG. 4. Imaging parameters 400 are specified by a user. These may include, for example, resolution, an undersampling factor and RF profiles. Randomized sampling patterns are generated 402 in real-time to determine which k-space samples will later be acquired in each spectral bin. These samples are ordered (e.g., in a radial order) in echo trains that determine gradient waveforms 404 that will be played out in MRI hardware for accelerated acquisition. Further processing is done to initialize all gradient and RF waveforms and timing information, and the pulse sequence 406 is played out by the scanner hardware 408.

Undersampled multispectral data 412 is acquired and transferred 410 from the scanner memory to a storage medium for processing. Using robust PCA 414, on-resonance and off-resonance images 416 are reconstructed from the undersampled data on a central processing unit or graphics processing unit and summed 418 to produce a final image 420, which is presented to the user on a display.

Robust data-driven parallel imaging is typically required for 3D MSI due to the difficulty of obtaining accurate sensitivity maps [16]. In undersampled acquisitions, the size of the calibration region required for autocalibrating parallel imaging methods is relatively large (FIG. 3), limiting the achievable acceleration factors and sampling properties. Another challenge is that partial k-space acquisitions are typically used, and the reconstruction should therefore maintain compatibility with both parallel imaging and partial k-space.

To allow flexible undersampling with robust parallel imaging and partial k-space, embodiments of the invention use a novel calibration-free reconstruction that is an extension of calibration-free parallel imaging reconstruction with CLEAR [12]. CLEAR uses the locally low rank property of multi-coil images instead of sensitivity maps or a calibration kernel in parallel imaging.

We briefly review the details of CLEAR here. Let an image at channel c be represented by the vector $X_c$ and concatenate these vectors in the matrix $$X=[X_1 X_2 \ldots X_{N_C}] \quad (6)$$

Let $R_b$ be an operator from the domain of X to $\mathbb{C}^{B \times B}$ that extracts a small B×B block centered around voxel b from an image. Let $S_c$ be the vectorized sensitivity of channel c and S be the concatenation $$S=[S_1 S_2 \ldots S_{N_C}] \quad (7)$$

The multi-channel image X can be written as X=S diag ($X_0$), where $X_0$ is the underlying magnetization. In block b, the relationship can be written $$R_b X = \text{diag}(R_b X_0) R_b S. \quad (8)$$

The matrix diag ($R_b X_0$) is full rank in general, and therefore, the rank of the matrix $R_b X$ is controlled by the rank of $R_b S$. The rank of $R_b S$ is low due to the inherent property of coil sensitivities, that they have a compact representation in some common basis. One way of inducing this property is with a block-wise rank penalty, which can be relaxed to its convex envelope, the nuclear norm, and written as $$J_{CLEAR,1}(x) = \lambda \sum_b \|R_b X\|_*, \quad (9)$$

where the sum is over non-overlapping blocks that uniformly tile the image domain. Eq. (9) induces linear dependencies between channels but does not require estimation of channel sensitivities or calibration.

Embodiments of the present invention use an extension of CLEAR that allows acceleration from parallel imaging and partial k-space. We observe that modulating a magnitude image by a smooth phase term and extracting real and imaginary parts is equivalent to weighting it with real-valued channel sensitivities. This can be seen by rewriting Eq. (8) in terms of a real-valued matrix $$R_b[\Re X \quad \Im X] = [\Re\{\text{diag}(R_b X_0) R_b S\} \quad \Im\{\text{diag}(R_b X_0) R_b S\}] \quad (10)$$

$$= \text{diag}(R_b|X_0|) R_b[\text{diag}(\cos(\angle X_0))S \quad \text{diag}(\sin(\angle X_0))S] \quad (11)$$

where $|X_0|$ and $\angle X_0$ are the magnitude and phase of $X_0$ respectively. Analogous to the matrix in (8), the real-valued sensitivity matrix $$R_b[\text{diag}(\cos(\angle X_0))S \quad \text{diag}(\sin(\angle X_0))S] \quad (12)$$

can be viewed as $2N_c$ real-valued channel sensitivities and the rank-controlling factor. Its rank is low when the low rank property of $R_b S$ from CLEAR and the smoothness of the image phase hold jointly. In particular, if the phase is made constant, the rank is halved. The convex penalty analogous to (9) that can be used in (4) is $$J_{CLEAR,2}(x) = \lambda \sum_b \|[\Re R_b X \quad \Im R_b X]\|_*. \quad (13)$$

The sum in (13) roughly captures the total amount of phase variation in the image domain. It is convex and straightforward to integrate in existing locally low rank reconstruction. Like CLEAR, it scales favorably with the size of the target image and number of coils, which is challenging for k-space-based methods.

To investigate the accuracy of the proposed reconstructions, experiments with retrospective undersampling were performed on a subject with a hip implant. Scan parameters: 1.5 T MRI system (Signa HDx, GE Healthcare, Waukesha, Wis.), TE=14.1 ms, TR=1 second, matrix size=512×256×24, 2×2 uniform subsampling for parallel imaging. Data were reconstructed with an autocalibrating parallel imaging method to provide "fully-sampled" data, which were then retrospectively undersampled. Non-overlapping 8×8 blocks with periodic boundary conditions were used in Eq. (13).

Figure 5:
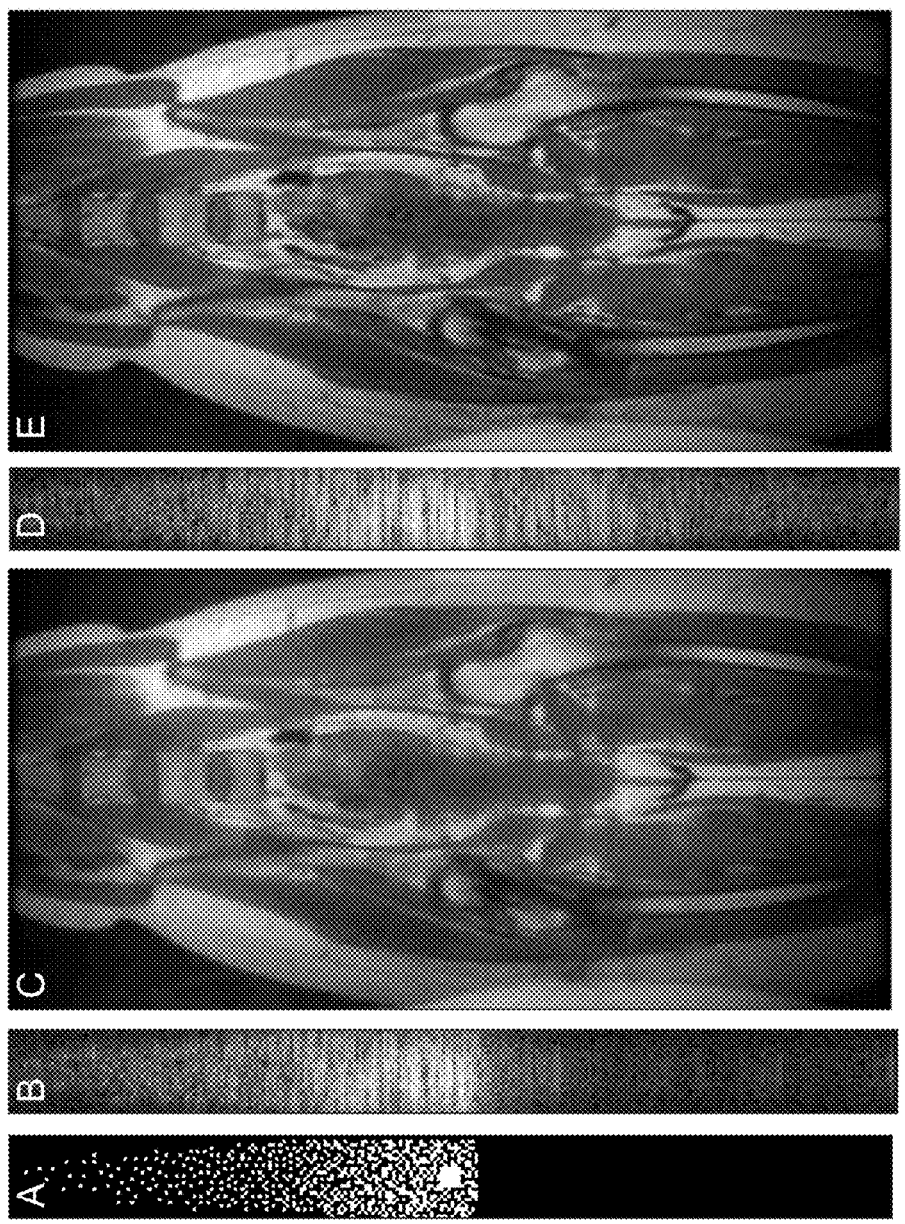
FIG. 5 is a series of images illustrating how the unmodified CLEAR technique does not recover both halves of k-space, as seen in images A, B, C; modification of the present invention in accordance with an embodiment of the invention results in roughly equal recovery of both halves of k-space, as seen in images D, E.

To test calibration-free reconstruction, images were reconstructed on a bin-by-bin basis from partial $k_y$-accelerated data using CLEAR and using the proposed extension. As shown in FIG. 5, CLEAR applied to partial k-space data (pattern shown in image A) does not impose smooth phase variation and does not recover both halves of k-space as seen in the $k_y$-$k_z$-plane for the first coil (image B) and the sum-of-squares combined image (image C). Thus, reconstructions show that CLEAR does not recover both halves of k-space. Modifying CLEAR to separate real and imaginary parts also imposes smooth phase variation, which results in roughly symmetric recovery of both halves of k-space (images D and E).

To test robust PCA reconstruction, data were retrospectively undersampled using partial $k_y$-accelerated variable-density complementary Poisson-disc sampling patterns at a range of reduction factors from 9.2 to 38.4. Robust PCA reconstructions were compared to bin-by-bin compressed sensing reconstructions without separation of on and off-resonance, which were performed by solving $$\underset{X}{\text{minimize}} \|Y - D\mathcal{F}X\|_F^2 + \lambda_S \|TX\|_{2,1} + J_{CLEAR,2}(X) \quad (14)$$

All reconstructions used a 3D wavelet transform in y-z-bins space for T.

Figure 6:
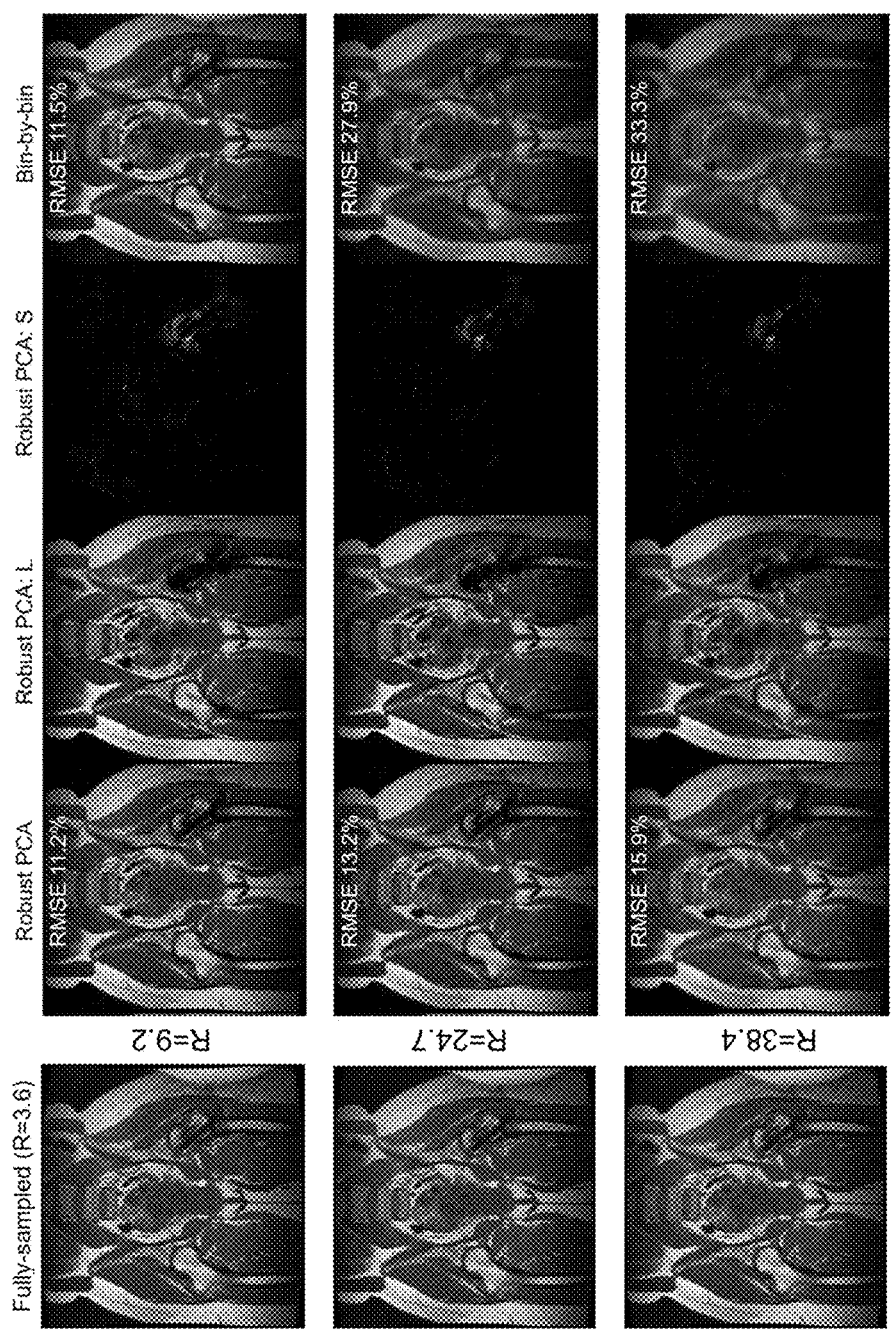
FIG. 6 is a series of images reconstructed with bin-by-bin compressed sensing and robust PCA from k-space data, according to an embodiment of the invention.

FIG. 6 shows coronal images reconstructed with robust PCA and bin-by-bin compressed sensing (CS) from k-space data. The k-space data was retrospectively undersampled with three reduction factors (R=9.2, R=24.7, R=38.4), each shown as a row in FIG. 6. Each row includes, from left to right, a fully sampled (R=3.6) image, final reconstructed robust PCA image, L and S component images showing the separation of on-resonance and off-resonance signals, and image reconstructed with bin-by-bin CS. At high reduction factors, bin-by-bin CS reconstructions show blurring and robust PCA reconstructions appear comparable in sharpness to fully-sampled images.

Figure 7:
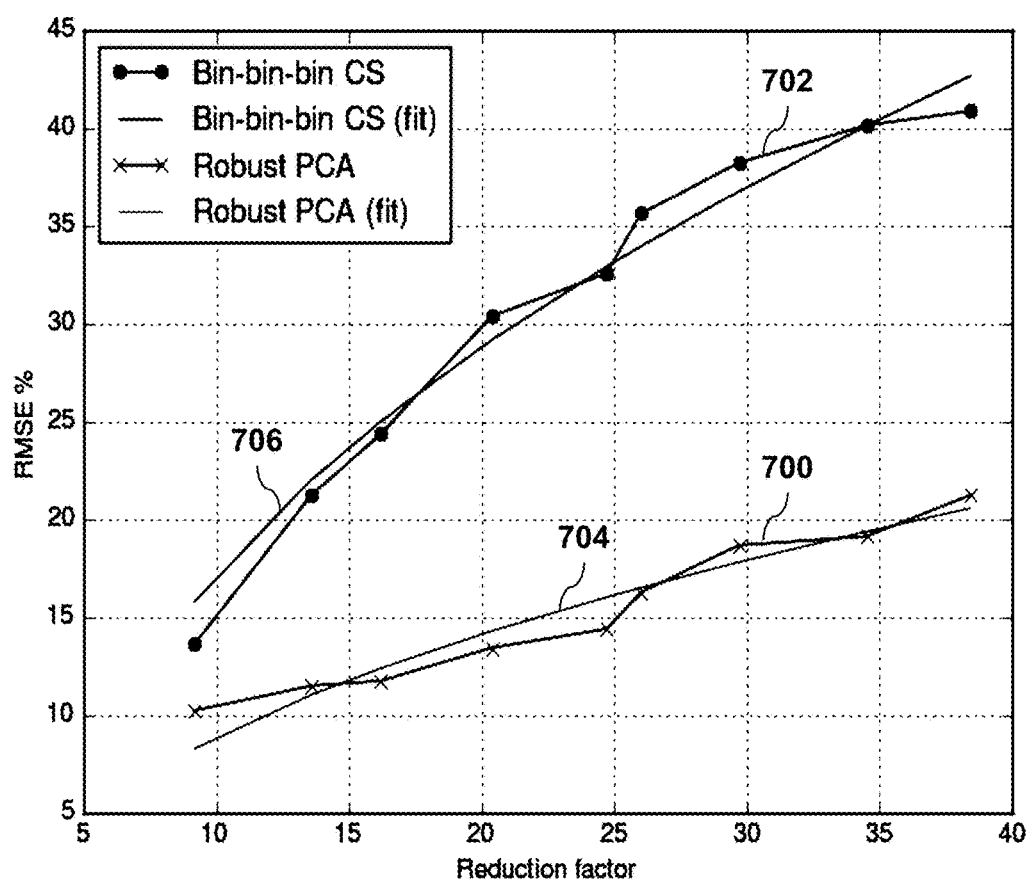
FIG. 7 is a graph of RMSE % vs reduction factor, showing that robust PCA reconstructions had higher peak signal-to-noise ratios than bin-by-bin reconstructions and roughly follow a $\sqrt{R}$-SNR penalty (fitted), according to an embodiment of the invention.

FIG. 7 is a graph of RMSE % vs. reduction factor. It shows that robust PCA reconstructions achieve lower RMSE over a range of reduction factors, with large differences (17.4%) at high reduction factors. Robust PCA reconstructions 700 had higher peak signal-to-noise ratios than bin-by-bin reconstructions 702, and the undersampling-SNR tradeoff in robust PCA images roughly follow a $\sqrt{R}$-SNR penalty. Shown also are fits of these to $\sqrt{R}$-SNR curves 704 and 706.

Many variations in the embodiments described above are possible and envisioned within the scope of the invention. Following are some examples of ways in which the techniques described above may be altered or extended.

A common choice of low-rank inducing penalty is the convex envelope of rank, the nuclear norm:

$$J_C(C_z) = \lambda \|C_z\|_*. \quad (15)$$

However, this requires choosing $\lambda$ and does not guarantee that the rank is 1. Another choice of $J_C$ that makes each $C_z$ a be rank 1 without introducing a parameter is $$J_C(C_z) = \begin{cases} \infty, & \text{if rank}(C_z) > 1 \\ 0, & \text{otherwise} \end{cases} \quad (16)$$

Any fixed sparsifying transform T (e.g. identity, wavelets) may be chosen, and may be applied bin-by-bin in y-z space or in y-z-bins space.

The penalty term used for CLEAR parallel imaging may be substituted with another constraint for autocalibrating parallel imaging, such as self-consistency [17]. Alter-natively, it may be removed, and $\mathcal{F}_u$ may be substituted with a sensitivity encoding $\mathcal{F}$ operator that includes channel sensitivity maps estimated from a calibration scan or undersampled data.

Either Eq. (9) or Eq. (13) can be used for the CLEAR penalty term in P1. $C$

The $C_z$ matrix constructions result in high matrix anisotropy (m c 2000 rows containing 8 channels and 256 y locations and n=24 columns containing bins). To reduce the computational cost of the SVD ($O(m^2n + n^2m)$), several simple strategies are possible. One is to compute a partial SVD ($O(k^2m)$), where k is the rank). Another is to use one of several fast randomized algorithms for computing low rank approximations of matrices by randomly sampling rows [18, 19, 20].

The $C_z$ matrix constructions can be performed on a coil-by-coil basis, where each $C_z$ matrix contains voxels from a single coil.

The reconstruction can be performed using a single or multi-core central processing unit or graphics processing unit or a computing cluster. As with many 3D techniques, an inverse Fourier transform along the readout (x) direction can be used to decouple the reconstruction at each x location, allowing additional parallelism.

Although we have described reconstruction from undersampled data, the model can be used to denoise fully-sampled or reconstructed images. Each $C_z$ matrix can be decomposed into its first principal component and residual as in FIG. 2. The noise in the residual can then be attenuated easily (e.g., via soft thresholding), and the denoised images can be recovered by summing the two components and reformatting them into images.

If the bin profile in the absence of metal is known from a model, the $C_z$ matrices can be substituted with the outer product $u_z v_z^H$, where $u_z$ is the known bin profile. The reconstructions can then be performed by solving for the unknown amplitudes $v_z$.

Imaging can be accelerated using a variety of pseudorandom k-space sampling schemes. If there is overlap in slice profiles, it is beneficial to avoid sampling near an acquired sample in k-space and in adjacent bins, and sampling strategies from dynamic MRI can be used to provide appropriate sample distributions across bins [11]. If regular sampling patterns are used, they can be shifted in successive bins to ensure complementary sampling.

In summary, embodiments of the invention provide a method and system for accelerating MRI near metal implants. It separates on and off-resonance in images from 3D MSI sequences, whereby the dominant on-resonance signal is represented by a rank one matrix and off-resonance signal is represented as a sparse error. A complementary sampling pattern is used to vary aliasing in different spectral bins, and these sampling properties are enabled by a calibration-free parallel imaging model used in conjunction with separation of on- and off-resonance signals.

REFERENCES

[1] Kevin M Koch, John E Lorbiecki, R Scott Hinks, and Kevin F King. A multispectral three-dimensional acquisition technique for imaging near metal implants. *Magnetic Resonance in Medicine*, 61(2):381-390, 2009.

[2] K M Koch, A C Brau, W Chen, G E Gold, B A Hargreaves, M Koff, G C McKinnon, H G Potter, and K F King. Imaging near metal with a mavric-semac hybrid. *Magnetic Resonance in Medicine*, 65(1):71-82, 2011.

[3] Pauline W Worters, Kyunghyun Sung, Kathryn J Stevens, Kevin M Koch, and Brian A Hargreaves. Compressed-sensing multispectral imaging of the postoperative spine. *Journal of Magnetic Resonance Imaging*, 37(1):243-248, 2013.

[4] Ricardo Otazo, Mathias Nittka, Mary Bruno, Esther Raithel, Christian Geppert, Sote-rios Gyftopoulos, Michael Recht, and Leon Rybak. Sparse-semac: rapid and improved semac metal implant imaging using sparse-sense acceleration. *Magnetic Resonance in Medicine*, 2016.

[5] Kevin Koch and Kevin King. Combined parallel imaging and compressed sensing on 3d multi-spectral imaging near metal implants. In *Proceedings of the 21st Annual Meeting of ISMRM, Montreal, Canada*, page 3172, 2011.

[6] Bragi Sveinsson, Pauline W Worters, Garry E Gold, and Brian A Hargreaves. Hexagonal undersampling for faster MRI near metallic implants. *Magnetic Resonance in Medicine*, pages n/a-n/a, 2014.

[7] Xinwei Shi, Evan Levine, and Brian Hargreaves. Accelerated imaging of metallic implants using model-based nonlinear reconstruction. In *Proceedings of the 24th Annual Meeting of ISMRM, Singapore*, 2016.

[8] Andrew Nencka, Shiv Kaushik, and Kevin Koch. Reduced field of view multi-spectral imaging through coupled coil and frequency bin encoding. In *Proceedings of the 24th Annual Meeting of ISMRM, Singapore*, page 2257, 2016.

[9] Matthew R Smith, Nathan S Artz, Kevin M Koch, Alexey Samsonov, and Scott B Reeder. Accelerating sequences in the presence of metal by exploiting the spatial distribution of off-resonance. *Magnetic Resonance in Medicine*, 72(6):1658-1667, 2014.

[10] D Yoon, V Taviani, P Worters, and B Hargreaves. Fast semac by separation of on-resonance and off-resonance signals. In *Proc Int Soc Magn Reson Med*, volume 91, 2014.

[11] Evan Levine, Bruce Daniel, Shreyas Vasanawala, Brian Hargreaves, and Manojkumar Saranathan. 3d cartesian mri with compressed sensing and variable view sharing using complementary poisson-disc sampling. *Magnetic Resonance in Medicine*, pages n/a-n/a, 2016.

[12] Joshua D Trzasko and Armando Manduca. Calibration-less parallel mri using clear. In Signals, Systems and Computers (ASILOMAR), 2011 *Conference Record of the Forty Fifth Asilomar Conference on*, pages 75-79. IEEE, 2011.

[13] John Wright, Arvind Ganesh, Shankar Rao, Yigang Peng, and Yi Ma. Robust principal component analysis: Exact recovery of corrupted low-rank matrices via convex optimization. In *Advances in neural information processing systems*, pages 2080-2088, 2009.

[14] Emmanuel J Candes, Xiaodong Li, Yi Ma, and John Wright. Robust principal component analysis? *Journal of the ACM (JACM)*, 58(3):11, 2011.

[15] Stephen Boyd, Neal Parikh, Eric Chu, Borja Peleato, and Jonathan Eckstein. Dis-tributed optimization and statistical learning via the alternating direction method of multipliers. *Foundations and Trends@ in Machine Learning*, 3(1):1-122, 2011.

[16] W Chen, P Beatty, K M Koch, and A Brau. Parallel mri near metallic implants. In *Proc Int Soc Magn Reson Med*, volume 2783, 2009.

[17] Michael Lustig and John M Pauly. SPIRiT: Iterative self-consistent parallel imaging reconstruction from arbitrary k-space. *Magnetic Resonance in Medicine*, 64(2):457-471, August 2010.

[18] Dimitris Achlioptas and Frank McSherry. Fast computation of low-rank matrix approximations. *Journal of the ACM (JACM)*, 54(2):9, 2007.

[19] Nathan Halko, Per-Gunnar Martinsson, and Joel A Tropp. Finding structure with ran-domness: Probabilistic algorithms for constructing approximate matrix decompositions. *SIAM review*, 53(2):217-288, 2011.

[20] Edo Liberty, Franco Woolfe, Per-Gunnar Martinsson, Vladimir Rokhlin, and Mark Tygert. Randomized algorithms for the low-rank approximation of matrices. *Proceedings of the National Academy of Sciences*, 104(51):20167-20172, 2007.

What is claimed is:

1. A method of accelerated 3D multispectral imaging (MSI) based on phase-encoding in two dimensions and frequency-encoding in the third, implemented on a magnetic resonance imaging (MRI) system, the method comprising:
generating randomized k-space undersampling patterns to determine k-space samples to be acquired in each spectral bin;
ordering k-space samples into echo trains that determine gradient waveforms;
initializing the gradient waveforms, RF waveforms, and timing information;
playing the gradient and RF waveforms using the timing information to excite and refocus different spatial and spectral bin regions;
acquiring undersampled MRI signal data on the MRI system from the spatial and spectral bin regions;
reconstructing on-resonance images and off-resonance images represented as sets of low rank and sparse matrices from the undersampled MRI signal data, wherein the reconstructing uses a robust-principal-component-analysis-based algorithm implemented on a CPU or GPU;
combining the on-resonance images and off-resonance images on the CPU or GPU to yield a final image;
presenting the final image on a display.

2. The method of claim 1, wherein reconstructing on-resonance images and off-resonance images comprises constraining a low rank matrix used in the robust-principal-component-analysis-based algorithm to have rank one.

3. The method of claim 1, wherein reconstructing on-resonance images and off-resonance images comprises representing the off-resonance images in a transform domain using a fixed, non-adaptive transform.

4. The method of claim 1, wherein reconstructing on-resonance images and off-resonance images comprises using CLEAR to impose an additional penalty to enable a combination with parallel imaging.

5. The method of claim 1, wherein reconstructing on-resonance images and off-resonance images comprises using a modified CLEAR penalty to impose an additional penalty to enable a combination of partial k-space acceleration and parallel imaging.

6. The method of claim 1, wherein reconstructing on-resonance images and off-resonance images comprises incorporating a constraint for autocalibrating parallel imaging.

7. The method of claim 6, wherein incorporating the constraint for autocalibrating parallel imaging uses an explicit model of coil sensitivities.

8. The method of claim 6, wherein incorporating the constraint for autocalibrating parallel imaging uses kernel encoding local correlations in k-space.

9. The method of claim 1, wherein reconstructing on-resonance images and off-resonance images comprises performing all matrix constructions on a coil-by-coil basis, yielding unique rank one and sparse matrices for each coil.

10. The method of claim 1, wherein reconstructing on-resonance images and off-resonance images comprises performing all matrix constructions at each readout location, yielding unique rank one and sparse matrices for each readout location and enabling reconstructions of each readout location to be carried out in parallel.

11. The method of claim 1, wherein reconstructing on-resonance images and off-resonance images comprises performing all matrix constructions within contiguous segments along the y dimension, yielding unique rank one and sparse matrices for each coil.

12. The method of claim 1, wherein reconstructing on-resonance images and off-resonance images comprises incorporating a pre-computed on-resonance bin profile with a spatially-varying scaling to model the on-resonance signal, while the sparsity of the off-resonance signal is maintained.

13. The method of claim 1, wherein generating randomized k-space undersampling patterns comprises using variable-density sampling patterns to decrease sampling density towards outer regions of k-space.

14. The method of claim 1, wherein generating randomized k-space undersampling patterns comprises varying the undersampling patterns in different bins.

15. The method of claim 14, wherein the variations in undersampling patterns in different bins are chosen to impose a separation between samples that is determined by the slice profiles and overlap.

16. The method of claim 1, wherein generating randomized k-space undersampling patterns comprises using complementary Poisson-disc sampling patterns to generate the randomized k-space undersampling patterns and achieve a variation between sampling in different bins.

17. The method of claim 1, wherein generating randomized k-space undersampling patterns comprises performing partial k-space sampling, where one side of k-space is not acquired and reconstructing images comprises an assumption of slow phase variation in the images.

* * * * *